United States Patent
Lee et al.

(10) Patent No.: US 12,305,079 B2
(45) Date of Patent: May 20, 2025

(54) CMP SLURRY COMPOSITION FOR POLISHING POLYCRYSTALLINE SILICON AND POLISHING METHOD USING SAME

(71) Applicant: KCTECH CO., LTD., Gyeonggi-do (KR)

(72) Inventors: Jae Woo Lee, Gyeonggi-do (KR); Ji Hye Kim, Gyeonggi-do (KR); Bo Hyeok Choi, Gyeonggi-do (KR)

(73) Assignee: KCTECH Co., Ltd. (KR)

( * ) Notice: Subject to any disclaimer, the term of this patent is extended or adjusted under 35 U.S.C. 154(b) by 839 days.

(21) Appl. No.: 17/418,546

(22) PCT Filed: Nov. 18, 2019

(86) PCT No.: PCT/KR2019/015718
§ 371 (c)(1),
(2) Date: Jun. 25, 2021

(87) PCT Pub. No.: WO2020/138717
PCT Pub. Date: Jul. 2, 2020

(65) Prior Publication Data
US 2022/0119679 A1   Apr. 21, 2022

(30) Foreign Application Priority Data
Dec. 28, 2018   (KR) .................. 10-2018-0172255

(51) Int. Cl.
*C09G 1/02* (2006.01)
*H01L 21/321* (2006.01)
*B82Y 40/00* (2011.01)

(52) U.S. Cl.
CPC ............ *C09G 1/02* (2013.01); *H01L 21/3212* (2013.01); *B82Y 40/00* (2013.01)

(58) Field of Classification Search
CPC .......... C09G 1/02; C09K 3/14; C09K 3/1409; C09K 3/1463; H01L 21/3212
See application file for complete search history.

(56) References Cited

U.S. PATENT DOCUMENTS

| 2013/0146804 A1* | 6/2013 | Mizuno .................... C09G 1/02 252/79.1 |
| 2015/0102012 A1 | 4/2015 | Reiss et al. |
| 2017/0014969 A1* | 1/2017 | Lam .......................... C09G 1/02 |
| 2017/0037278 A1* | 2/2017 | Masuda ............ H01L 21/30625 |

(Continued)

FOREIGN PATENT DOCUMENTS

| KR | 20030042147 A | 5/2003 |
| KR | 20140085253 A | 7/2014 |

(Continued)

OTHER PUBLICATIONS

International Search Report for Patent Application No. PCT/KR2019/015718, mailed Feb. 25, 2020, 2 pages.

*Primary Examiner* — Pegah Parvini
(74) *Attorney, Agent, or Firm* — KDW Firm PLLC (57) ABSTRACT

The present disclosure relates to a CMP slurry composition for polishing polycrystalline silicon and a polishing method using the same. A CMP slurry composition for polishing polycrystalline silicon according to an embodiment of the present disclosure includes: abrasive particles; a surface roughness reducing agent; a polishing regulator containing an organic acid; and a pH regulator.

12 Claims, 2 Drawing Sheets

(56) References Cited

U.S. PATENT DOCUMENTS

2017/0081552 A1* 3/2017 Yamato ............. H01L 21/32115
2017/0283673 A1* 10/2017 Zhou ..................... H01L 21/463

FOREIGN PATENT DOCUMENTS

| KR | 20170105515 A | 9/2017 | | |
|----|---------------|--------|---|---|
| KR | 20180078653 A | 7/2018 | | |
| KR | 20200046510 A | 5/2020 | | |
| TW | 201002806 | * | 5/2009 | .............. C09K 3/14 |
| TW | 201002806 A | 1/2010 | | |
| TW | 201514288 A | 4/2015 | | |
| TW | 201738338 A | 11/2017 | | |

* cited by examiner

CMP SLURRY COMPOSITION FOR POLISHING POLYCRYSTALLINE SILICON AND POLISHING METHOD USING SAME

CROSS-REFERENCE TO RELATED APPLICATIONS

This application is a national phase entry of, claims the benefit of and priority to previously filed International Patent Application No. PCT/KR2019/015718, entitled "CMP SLURRY COMPOSITION FOR POLISHING POLYCRYSTALLINE SILICON AND POLISHING METHOD USING SAME", filed Nov. 18, 2019, which claims priority to Korean Patent Application No. 10-2018-0172255, filed Dec. 28, 2018, which are hereby incorporated by reference in their entireties.

TECHNICAL FIELD

The present disclosure relates to a chemical mechanical polishing (CMP) slurry composition for polishing polycrystalline silicon and a polishing method using the same.

BACKGROUND ART

Low-temperature polycrystalline silicon is obtained by crystallizing amorphous silicon at a low temperature and is widely used as a channel layer of a thin film transistor. A low-temperature polycrystalline silicon film used as a channel layer of a thin film transistor may be obtained by crystallizing an amorphous silicon film using various crystallization methods.

Among methods of crystallizing an amorphous silicon film, a crystallization method using a laser is widely used because the crystallization method has a relatively low thermal influence on an insulating substrate such as a glass substrate and may form polycrystalline silicon that has excellent properties in comparison to polycrystalline silicon using a solid-phase crystallization method.

However, in the crystallization method using a laser, protrusions may be formed on a surface of a polycrystalline silicon film where crystallization is delayed due to a density difference generated when silicon changes from a liquid phase to a solid phase, so that the polycrystalline silicon film may have poor surface roughness. Protrusions formed on a surface of a polycrystalline silicon film formed based on a low-temperature crystallization method using a laser may be ½ to 2 times as high as the thickness of the polycrystalline silicon film.

Since it is inevitable to form such protrusions in a crystallization process of crystallizing an amorphous silicon film to a polycrystalline silicon film by a laser crystallization method, the protrusions may cause various defects in a subsequent process. For example, when a gate insulating layer and a metal material for a gate electrode are deposited on the polycrystalline silicon film, the gate insulating layer and the metal material may be formed along protrusions of polycrystalline silicon. Accordingly, the gate insulating layer and the metal material may have protrusions similar to protrusions of the polycrystalline silicon film.

Such protrusions in the gate insulating layer may reduce a breakdown voltage and increase a leakage current. Also, when the metal material with the protrusions is aluminum, a hillock may be caused by poor surface roughness of the metal material, thereby deteriorating characteristics of a device. In addition, the protrusions may cause nonuniformity in an etching process and an exposing process, thereby reducing reliability of the device.

A method of repeatedly performing wet air oxidation and treatment with hydrofluoric acid (HF) may be used to improve surface roughness of a polycrystalline silicon film. In the method, a process of oxidizing a surface of a polycrystalline silicon film using ozone water in a spin type wet station and performing treatment with HF in the same equipment to remove an oxide film formed on the surface of the polycrystalline silicon film is repeated multiple times to remove surface protrusions. However, since the process of oxidizing the surface and performing treatment with HF is performed multiple times in the method, the polycrystalline silicon film other than protrusions may also be lost, so that it may be impossible to selectively remove desired protrusions and process reliability may be reduced.

DISCLOSURE OF INVENTION

Technical Goals

To solve the above-described problems, an aspect of the present disclosure is to provide a chemical mechanical polishing (CMP) slurry composition for polishing polycrystalline silicon and a polishing method using the same that may minimize a damage to silicon crystals while improving surface roughness of a polycrystalline silicon film.

However, aspects of the present disclosure are not limited to the one set forth herein, and other aspects not mentioned herein would be clearly understood by one of ordinary skill in the art from the following description.

Technical Solutions

According to an aspect of the present disclosure, there is provided a chemical mechanical polishing (CMP) slurry composition for polishing polycrystalline silicon including: abrasive particles; surface roughness modifier; a polishing regulator including an organic acid; and a pH regulator.

According to an example embodiment, the abrasive particles may include at least one selected from a group consisting of a metal oxide, a metal oxide coated with an organic material or inorganic material, and the metal oxide in a colloidal phase, and the metal oxide may include at least one selected from a group consisting of silica, ceria, zirconia, alumina, titania, barium titania, germania, mangania, and magnesia.

According to an example embodiment, the abrasive particles may be prepared using a liquid-phase synthesis method and may be dispersed so that surfaces of the abrasive particles may have negative charges.

According to an example embodiment, the abrasive particles may have a size of 10 nanometers (nm) to 200 nm.

According to an example embodiment, the abrasive particles may be present in an amount of 0.1% by weight (wt %) to 10 wt % in the CMP slurry composition for polishing polycrystalline silicon.

According to an example embodiment, the surface roughness modifier may include a water-soluble polymer.

According to an example embodiment, the water-soluble polymer may have a weight-average molecular weight of 1,000 to 100,000.

According to an example embodiment, the water-soluble polymer may include at least one selected from a group consisting of hydroxyethyl cellulose (HEC), hydroxymethyl cellulose (HMC), hydroxypropyl cellulose (HPC), hydroxypropyl methylcellulose (HPMC), carboxymethyl cellulose (CMC), methylcellulose (MC), methyl hydroxyethyl cellulose (MHEC), chitosan, gelatin, xanthan gum, collagen, carrageenan, flurane, pectin, chondroitin sulfate, alginic acid, dextran, beta-glucan, and hyaluronic acid.

According to an example embodiment, the surface roughness modifier may be present in an amount of 0.0005 wt % to 0.5 wt % in the CMP slurry composition for polishing polycrystalline silicon.

According to an example embodiment, the polishing regulator may include at least one selected from a group consisting of succinic acid, malic acid, malonic acid, adipic acid, tartaric acid, glutaric acid, glycollic acid, aspartic acid, itaconic acid, tricarballylic acid, pimelic acid, suberic acid, sebacic acid, stearic acid, pyruvic acid, acetoacetic acid, glyoxylic acid, azelaic acid, fumaric acid, glutaconic acid, traumatic acid, muconic acid, aconitic acid, carballylic acid, tribasic acid, mellitic acid, isocitric acid, citric acid, lactic acid, gluconic acid, maleic acid, ascorbic acid, iminoacetic acid, oxalic acid, pyrogallic acid, formic acid, acetic acid, propionic acid, butyric acid, valeric acid, hexanoic acid, heptanoic acid, caprylic acid, nonanoic acid, decanoic acid, undecylenic acid, lauric acid, tridecylic acid, myristic acid, pentadecanoic acid, and palmitic acid.

According to an example embodiment, the polishing regulator may be present in an amount of 0.01 wt % to 1 wt % in the CMP slurry composition for polishing polycrystalline silicon.

According to an example embodiment, the pH regulator may include at least one selected from a group consisting of triethanolamine, trimethanolamine, monoethanolamine, diethanolamine, dimethylbenzylamine, ethoxybenzylamine, 2-amino-2-methyl-1-propanol, 2-amino-2-ethyl-1,3-propanediol, tris(hydroxymethyl)aminomethane, 2-amino-1-butanol, 2-amino-2-methyl-1,3-propanediol, dimethylamino methylpropanol, diethylaminoethanol, monoisopropanolamine, aminoethylethanolamine, 3-amino-1-propanol, 2-amino-1-propanol, 1-amino-2-propanol, 1-amino-pentanol, 2-(2-aminoethylamino)ethanol, 2-dimethylamino-2-methyl-1-propanol, and N,N-diethylethanolamine.

According to an example embodiment, the ph regulator may be present in an amount of 0.01 wt % to 1 wt % in the CMP slurry composition for polishing polycrystalline silicon.

According to an example embodiment, pH of the CMP slurry composition for polishing polycrystalline silicon may be in a range of 3 to 7.

According to an example embodiment, after the polycrystalline silicon is polished using the CMP slurry composition for polishing polycrystalline silicon, the polished polycrystalline silicon may have a maximum peak-to-valley (Rpv) surface roughness of 4 nm or less and an arithmetic average roughness Ra of 0.4 nm or less.

According to an example embodiment, the slurry composition for polishing polycrystalline silicon may be used to remove a hillock on a polycrystalline silicon film.

According to another aspect of the present disclosure, there is provided a polishing method including polishing a semiconductor wafer including a polycrystalline silicon film using the CMP slurry composition for polishing polycrystalline silicon according to the aspect.

Effects

A chemical mechanical polishing (CMP) slurry composition for polishing polycrystalline silicon of the present disclosure may include a surface roughness modifier including a water-soluble polymer, thereby increasing a removal rate of a hillock of a surface generated when polycrystalline silicon is grown, and thereby improving surface roughness after polishing a polycrystalline silicon film. When the CMP slurry composition is applied to a thin film transistor, a thickness of an insulating film of the thin film transistor may be easily reduced and reliability of the thin film transistor may be enhanced due to the improved surface roughness. The above thin film transistor may be useful for a flat panel display device including an organic electroluminescent display device.

BEST MODE FOR CARRYING OUT THE INVENTION

Hereinafter, example embodiments of the present disclosure will be described in detail with reference to the accompanying drawings. However, various alterations and modifications may be made to the example embodiments. Here, the example embodiments are not construed as limited to the disclosure and should be understood to include all changes, equivalents, and replacements within the idea and the technical scope of the disclosure.

The terminology used herein is for the purpose of describing particular example embodiments only and is not to be limiting of the example embodiments. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related technologies will be omitted when it is deemed that such description will cause ambiguous interpretation of the present disclosure.

Hereinafter, a chemical mechanical polishing (CMP) slurry composition for polishing polycrystalline silicon and a polishing method using the same according to the present disclosure will be described in detail with reference to example embodiments and drawings. However, the present disclosure is not limited to the example embodiments and drawings.

According to an aspect of the present disclosure, there is provided a CMP slurry composition for polishing polycrystalline silicon which includes abrasive particles; surface roughness modifier; a polishing regulator including an organic acid; and a pH regulator.

The CMP slurry composition for polishing polycrystalline silicon of the present disclosure may include a surface roughness modifier including a water-soluble polymer, thereby increasing a removal rate of a hillock of a surface generated when polycrystalline silicon is grown, and thereby improving surface roughness after polishing a polycrystalline silicon film.

According to an example embodiment, the abrasive particles may include at least one selected from a group consisting of a metal oxide, a metal oxide coated with an organic material or inorganic material, and the metal oxide in a colloidal phase. The metal oxide may include at least one selected from a group consisting of silica, ceria, zirconia, alumina, titania, barium titania, germania, mangania, and magnesia.

According to an example embodiment, a surface of the abrasive particles may be modified from OH to COO⁻. Through the above surface modification, the abrasive particles may have strong negative charges in all pH ranges. Adsorption of the abrasive particles on the polycrystalline silicon film may be minimized after the polycrystalline silicon film is polished by a strong repulsive force between the surface-modified abrasive particles and the polycrystalline silicon film.

According to an example embodiment, the abrasive particles may be prepared by a liquid-phase synthesis method, and may be dispersed so that surfaces of the abrasive particles may have negative charges. The abrasive particles may include abrasive particles prepared by the liquid-phase synthesis method, but are not limited thereto. The liquid-phase synthesis method may include, for example, a sol-gel method of causing a chemical reaction of abrasive particle precursors in an aqueous solution and of growing crystals to obtain fine particles, or a coprecipitation method of precipitating abrasive particle ions in an aqueous solution, and a hydrothermal synthesis of forming abrasive particles at a high temperature under a high pressure. The abrasive particles prepared by the liquid-phase synthesis method may be dispersed so that surfaces of the abrasive particles may have negative charges.

According to an example embodiment, the abrasive particles may have a size of 10 nm to 200 nm. An average particle size of the abrasive particles may be measured as an average value of particle sizes of a plurality of particles within a field of view which may be measured by a scanning electron microscope analysis or dynamic light scattering. When the size of the abrasive particles is less than 10 nm, a polishing rate for the size of the abrasive particles may decrease, and it may be difficult to achieve a desired selectivity. When the size of the abrasive particles exceeds 200 nm, it may be difficult to control a selectivity due to excessive polishing, and dishing, erosion and surface defects may be likely to occur.

According to an example embodiment, the abrasive particles may be mixed particles with a multi-dispersion type particle distribution, in addition to a single-size particle. For example, abrasive particles with two different types of average particle sizes may be mixed to have a bimodal particle distribution, or abrasive particles with three different types of average particle sizes may be mixed to have a particle size distribution showing three peaks. Also, abrasive particles with at least four different types of average particle sizes may be mixed to have a multi-dispersion type particle distribution. Relatively large abrasive particles and relatively small abrasive particles may be mixed, thereby obtaining more excellent dispersibility and expecting an effect of reducing a number of scratches on a wafer surface.

According to an example embodiment, the abrasive particles may have at least one selected from a group consisting of a spherical shape, a square shape, a needle shape and a plate shape, and may desirably have the spherical shape.

According to an example embodiment, the abrasive particles may be single crystalline particles. When single crystalline abrasive particles are used, a scratch reduction effect may be achieved in comparison to polycrystalline abrasive particles, dishing may be improved, and cleanability after polishing may be enhanced.

According to an example embodiment, the abrasive particles may be present in an amount of 0.1 wt % to 10 wt % in the CMP slurry composition for polishing polycrystalline silicon. When the amount of the abrasive particles in the CMP slurry composition for polishing polycrystalline silicon is less than 1 wt %, a polishing speed may decrease. When the amount of the abrasive particles exceeds 10 wt %, the polishing speed may significantly increase, and surface defects may be caused by adsorbability of particles remaining on a surface due to an increase in a number of abrasive particles.

According to an example embodiment, the surface roughness modifier may include a water-soluble polymer.

According to an example embodiment, the water-soluble polymer may have a weight-average molecular weight of 1,000 to 100,000. When the weight average molecular weight of the water-soluble polymer is less than 1,000, a hillock on the polycrystalline silicon film may not be easily removed. When the weight average molecular weight of the water-soluble polymer exceeds 100,000, the hillock may be excessively removed and the polycrystalline silicon film may also be lost.

According to an example embodiment, to remove the hillock on the polycrystalline silicon film, forming a laminar flow between a pad and a polycrystalline silicon wafer by a slurry composition during polishing is important. When the slurry composition is in a turbulent flow state due to a failure of formation of the laminar flow between the pad and the polycrystalline silicon wafer, mechanical polishing may be irregularly performed so that a surface may be rough. To form a laminar flow, a water-soluble polymer with a relatively long molecular chain may desirably be added.

According to an example embodiment, the water-soluble polymer may include at least one selected from a group consisting of hydroxyethyl cellulose (HEC), hydroxymethyl cellulose (HMC), hydroxypropyl cellulose (HPC), hydroxypropyl methylcellulose (HPMC), carboxymethyl cellulose (CMC), methylcellulose (MC), methyl hydroxyethyl cellulose (MHEC), chitosan, gelatin, xanthan gum, collagen, carrageenan, flurane, pectin, chondroitin sulfate, alginic acid, dextran, beta-glucan, and hyaluronic acid.

According to an example embodiment, water-soluble polymer cellulose in the water-soluble polymer may be cellulose obtained from photosynthesis of plants and may be prepared and used by hydrolyzing lignocellulosic cellulose regardless of a presence or absence of lignin, and water-soluble polymer cellulose industrially prepared and sold may be used.

According to an example embodiment, the surface roughness modifier may be present in an amount of 0.0005 wt % to 0.5 wt % in the CMP slurry composition for polishing polycrystalline silicon. When the amount of the surface roughness modifier in the CMP slurry composition for polishing polycrystalline silicon is less than 0.0005 wt %, the hillock on the polycrystalline silicon film may not be easily removed. When the amount of the surface roughness modifier exceeds 0.5 wt %, the hillock may be excessively removed, and the polycrystalline silicon film may also be lost.

According to an example embodiment, the polishing regulator may include at least one selected from a group consisting of succinic acid, malic acid, malonic acid, adipic acid, tartaric acid, glutaric acid, glycollic acid, aspartic acid, itaconic acid, tricarballylic acid, pimelic acid, suberic acid, sebacic acid, stearic acid, pyruvic acid, acetoacetic acid, glyoxylic acid, azelaic acid, fumaric acid, glutaconic acid, traumatic acid, muconic acid, aconitic acid, carballylic acid, tribasic acid, mellitic acid, isocitric acid, citric acid, lactic acid, gluconic acid, maleic acid, ascorbic acid, iminoacetic acid, oxalic acid, pyrogallic acid, formic acid, acetic acid, propionic acid, butyric acid, valeric acid, hexanoic acid, heptanoic acid, caprylic acid, nonanoic acid, decanoic acid, undecylenic acid, lauric acid, tridecylic acid, myristic acid, pentadecanoic acid, and palmitic acid.

According to an example embodiment, the polishing regulator may be present in an amount of 0.01 wt % to 1 wt % in the CMP slurry composition for polishing polycrystalline silicon. When the amount of the polishing regulator in the CMP slurry composition for polishing polycrystalline silicon is less than 0.01 wt %, the polishing speed may decrease. When the amount of the polishing regulator exceeds 1 wt %, the polycrystalline silicon film may be excessively polished.

According to an example embodiment, the pH regulator may include at least one selected from a group consisting of triethanolamine, trimethanolamine, monoethanolamine, diethanolamine, dimethylbenzylamine, ethoxybenzylamine, 2-amino-2-methyl-1-propanol, 2-amino-2-1,3-propanediol, tris(hydroxymethyl)aminomethane, 2-amino-1-butanol, 2-amino-2-methyl-1,3-propanediol, dimethylamino methyl-propanol, diethylaminoethanol, monoisopropanolamine, aminoethylethanolamine, 3-amino-1-propanol, 2-amino-1-propanol, 1-amino-2-propanol, 1-amino-pentanol, 2-(2-aminoethylamino)ethanol, 2-dimethylamino-2-methyl-1-propanol, and N,N-diethylethanolamine.

According to an example embodiment, the pH regulator may be present in an amount of 0.01 wt % to 1 wt % in the CMP slurry composition for polishing polycrystalline silicon. When the amount of the pH regulator in the CMP slurry composition for polishing polycrystalline silicon is less than 0.01 wt %, the polishing speed may decrease. When the amount of the pH regulator exceeds 1 wt %, the polycrystalline silicon film may be excessively polished.

According to an example embodiment, pH of the CMP slurry composition for polishing polycrystalline silicon may be in a range of 3 to 7. The pH regulator may be added in an amount to adjust the pH of the CMP slurry composition for polishing polycrystalline silicon. When the pH of the CMP slurry composition for polishing polycrystalline silicon is out of the range, the polishing speed may decrease, defects such as surface imbalance or dishing may occur.

According to an example embodiment, the CMP slurry composition for polishing polycrystalline silicon may be a negative slurry composition that exhibits a zeta potential of "0" or negative charges. The CMP slurry composition for polishing polycrystalline silicon may have a zeta potential of −100 millivolts (mV) to 0 mV. Due to negatively charged abrasive particles, the CMP slurry composition for polishing polycrystalline silicon may be a negative slurry composition that exhibits negative charges. When the zeta potential is less than −100 mV, aggregation may occur due to weak dispersion by electrostatic repulsion.

According to an example embodiment, after the polycrystalline silicon is polished using the CMP slurry composition for polishing polycrystalline silicon, the polished polycrystalline silicon may have a maximum peak-to-valley (Rpv) surface roughness of 4 nm or less and an arithmetic average roughness Ra of 0.4 nm or less.

Roughness of a surface of a collected plate sample may be evaluated using an atomic force microscopy (AFM) and may be measured a value of a maximum peak-to-valley (Rpv) surface roughness and a value of an arithmetic average roughness Ra.

According to an example embodiment, the slurry composition for polishing polycrystalline silicon may be used to remove a hillock on a polycrystalline silicon film.

The CMP slurry composition for polishing polycrystalline silicon of the present disclosure may include the surface roughness modifier including the water-soluble polymer, thereby increasing a removal rate of a hillock of a surface generated when polycrystalline silicon is grown, and thereby improving surface roughness after polishing the polycrystalline silicon film. When the CMP slurry composition is applied to a thin film transistor, a thickness of an insulating film of the thin film transistor may be easily reduced and reliability of the thin film transistor may be enhanced due to the improved surface roughness. The above thin film transistor may be useful for a flat panel display device including an organic electroluminescent display device. The flat panel display device may include, for example, a plasma display panel (PDP) and a liquid crystal display (LCD), and the organic electroluminescent display device may include, for example, an organic light emitting diode (OLED), and the like.

According to another aspect of the present disclosure, there is provided a polishing method including polishing a semiconductor wafer including a polycrystalline silicon film using the CMP slurry composition for polishing polycrystalline silicon according to the aspect.

Hereinafter, the present disclosure will be described in detail with reference to examples and comparative examples. However, the technical idea of the present disclosure is not limited or restricted thereto.

Example 1

1 wt % of surface-modified colloidal silica particles (PL-3D) with a particle size of 80 nm, 0.3 wt % of succinic acid as carboxylic acid, and 0.05 wt % of hydroxyethyl cellulose (HEC) with a weight-average molecular weight of 90,000 as a surface roughness modifier were added and mixed with triethanolamine as a pH regulator, to prepare a CMP slurry composition for polishing polycrystalline silicon with pH of 4.

Polishing was performed using the CMP slurry composition for polishing polycrystalline silicon for 15 seconds (sec) under evaluation conditions of a pressure of 1 psi and a carrier RPM/platen RPM of 78/83.

Example 2

Polishing was performed for 60 seconds using the same CMP slurry composition for polishing polycrystalline silicon as that of Example 1.

Example 3

A CMP slurry composition for polishing multiple films was prepared in the same manner as in Example 1, except that, compared to Example 1, 0.1 wt % of hydroxyethyl cellulose (HEC) was added.

Polishing was performed under the same conditions as those of Example 1, except that, compared to Example 1, polishing was performed for 60 seconds.

Example 4

Polishing was performed using the same CMP slurry composition for polishing polycrystalline silicon as that of Example 1 under the same evaluation conditions as those of Example 1, except that the carrier RPM/platen RPM was 48/53.

Example 5

Polishing was performed using the same CMP slurry composition for polishing polycrystalline silicon as that of Example 4 under the same evaluation conditions as those of Example 4, except that, compared to Example 4, the polishing time was 60 seconds.

Example 6

A CMP slurry composition for polishing multiple films was prepared in the same manner as in Example 1, except that, compared to Example 5, 0.05 wt % of hydroxyethyl cellulose (HEC) was added.

Polishing was performed using the prepared CMP slurry composition for polishing polycrystalline silicon under the same conditions as those of Example 5.

Example 7

Polishing was performed using the same CMP slurry composition for polishing polycrystalline silicon as that of Example 6 under the same evaluation conditions as those of Example 6, except that the carrier RPM/platen RPM was 78/83.

Comparative Example 1

A CMP slurry composition for polishing multiple films was prepared in the same manner as in Example 1, except that, compared to Example 1, hydroxyethyl cellulose (HEC) was not added.

Polishing was performed using the prepared CMP slurry composition for polishing polycrystalline silicon under the same evaluation conditions, except that, compared to Example 1, the polishing time was 60 seconds.

Comparative Example 2

A CMP slurry composition for polishing multiple films was prepared in the same manner as in Comparative Example 1, except that, compared to Comparative Example 1, benzylamine (BA) was added as a pH regulator.

Polishing was performed using the prepared CMP slurry composition for polishing polycrystalline silicon under the same evaluation conditions as those of Comparative Example 1.

Comparative Example 3

A CMP slurry composition for polishing multiple films was prepared in the same manner as in Comparative Example 1, except that, compared to Comparative Example 1, PL-3L as abrasive particles was added and $NH_4OH$ was added as a pH regulator to adjust pH to 9.

Polishing was performed using the prepared CMP slurry composition for polishing polycrystalline silicon under the same evaluation conditions as those of Comparative Example 1.

Comparative Example 4

A CMP slurry composition for polishing multiple films was prepared in the same manner as in Comparative Example 1, except that, compared to Comparative Example 3, $NH_4OH$ was added as a pH regulator to adjust pH to 10.

Polishing was performed using the prepared CMP slurry composition for polishing polycrystalline silicon under the same evaluation conditions as those of Comparative Example 1.

Comparative Example 5

A CMP slurry composition for polishing multiple films was prepared in the same manner as in Example 1, except that, compared to Example 1, hydroxyethyl cellulose (HEC) was not added.

Polishing was performed using the prepared CMP slurry composition for polishing polycrystalline silicon under the same evaluation conditions as those of Example 1.

Comparative Example 6

A CMP slurry composition for polishing multiple films was prepared in the same manner as in Example 4, except that, compared to Example 4, hydroxyethyl cellulose (HEC) was not added.

Polishing was performed using the prepared CMP slurry composition for polishing polycrystalline silicon under the same evaluation conditions as those of Example 4.

A 300 mm blanket wafer was polished using the prepared CMP slurry composition for polishing polycrystalline silicon.

Common polishing conditions of Examples 1 to 7 and Comparative Examples 1 to 6 are shown below.

[Polishing Conditions]
1. Polishing machine: ST #01 (manufactured by KCTECH)
2. Pad: IC 1000 (manufactured by DOW)
3. Platen RPM: 78 rpm, 48 rpm
4. Spindle RPM: 83 rpm, 53 rpm
5. Flow rate: 250 ml
6. Polishing time: 60 sec
7. Used wafer: poly Si 4000 Å

Compositions, evaluation conditions, and surface roughness measurement results for the CMP slurry compositions for polishing polycrystalline silicon of Examples 1 to 7 and Comparative Examples 1 to 6 are shown in Table 1 below.

TABLE 1

| | Abrasive particles (colloidal silica) | | | | | Surface roughness modifier | | Evaluation conditions | | | Surface roughness measurement results | |
|---|---|---|---|---|---|---|---|---|---|---|---|---|
| | type | wt % | Particle size (nm) | pH regulator type | pH | type | wt % | Pressure (psi) | RPM (carrier/platen) | Polishing time (sec) | Ra (nm) | Rpv (nm) |
| Ex. 1 | PL-3D | 1 | 80 | TEA | 4 | HEC | 0.05 | 1 | 78/83 | 15 | 1.2 | 6.55 |
| Ex. 2 | | | | | | | 0.05 | 1 | 78/83 | 60 | 0.2 | 2.07 |
| Ex. 3 | | | | | | | 0.1 | 1 | 78/83 | 60 | 0.34 | 2.31 |
| Ex. 4 | | | | | | | 0.05 | 1 | 48/53 | 15 | 0.26 | 5.67 |
| Ex. 5 | | | | | | | 0.05 | 1 | 48/53 | 60 | 0.33 | 2.64 |
| Ex. 6 | | | | | | | 0.05 | 2 | 48/53 | 60 | 0.3 | 1.83 |
| Ex. 7 | | | | | | | 0.05 | 2 | 78/83 | 60 | 0.3 | 2.03 |
| Comp. Ex. 1 | | | | | | — | — | 1 | 78/83 | 60 | 0.45 | 4.24 |
| Comp. Ex. 2 | | | | BA | | — | — | 1 | 78/83 | 60 | 0.77 | 6.03 |
| Comp. Ex. 3 | PL-3L | | | NH₄OH | 9 | — | — | 1 | 78/83 | 60 | 0.63 | 6.44 |
| Comp. Ex. 4 | | | | | 10 | — | — | 1 | 78/83 | 60 | 0.77 | 4.97 |
| Comp. Ex. 5 | PL-3D | | | TEA | 4 | — | — | 1 | 78/83 | 15 | 2.43 | 10.54 |
| Comp. Ex. 6 | | | | | | — | — | 1 | 48/53 | 15 | 1.08 | 8.66 |

Figure 1A:
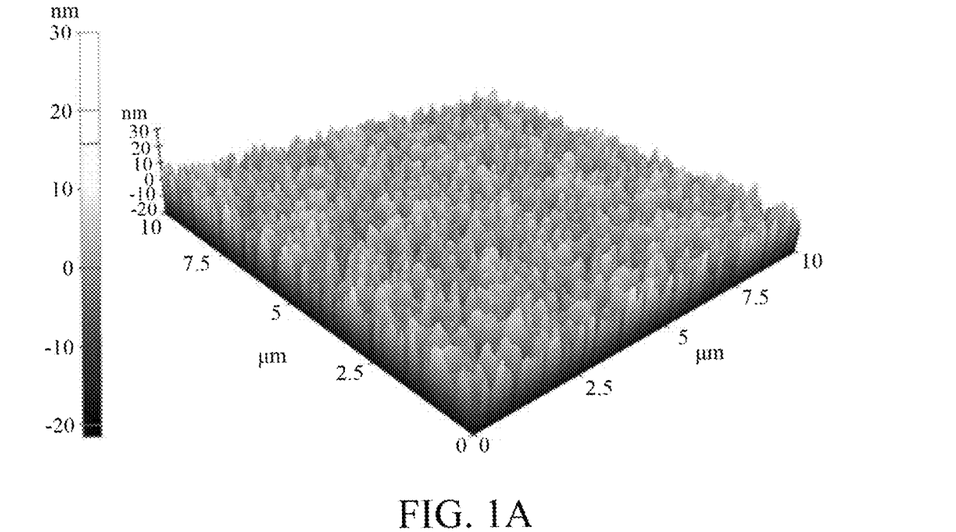
FIG. 1A is an atomic force microscopy (AFM) image showing a surface of a polycrystalline silicon film before polishing.
Figure 1B:
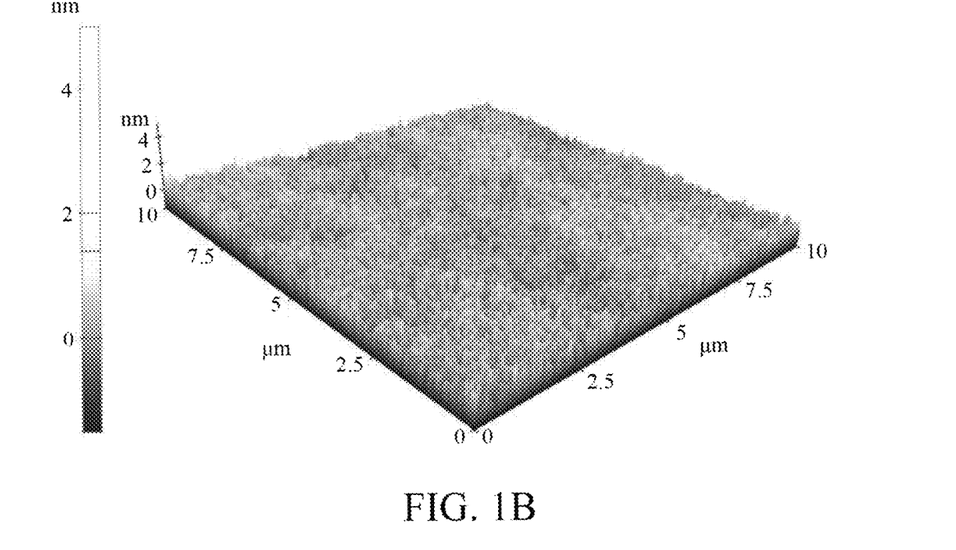
FIG. 1B is an AFM image showing a surface after polishing is performed using a chemical mechanical polishing (CMP) slurry composition for polishing polycrystalline silicon of Example 2 of the present disclosure.

FIG. 1A is an AFM image showing a surface of a polycrystalline silicon film before polishing. FIG. 1B is an AFM image showing a surface after polishing is performed using the CMP slurry composition for polishing polycrystalline silicon of Example 2 of the present disclosure.

Referring to FIG. 1A, it may be confirmed that a surface of a polycrystalline silicon film before polishing is very uneven due to a hillock. The polycrystalline silicon film before polishing has a maximum peak-to-valley (Rpv) surface roughness of 37.417 nm and an arithmetic average roughness Ra of 4.098 nm. Referring to FIG. 1B, it may be confirmed that a surface roughness of a polycrystalline silicon film is noticeably improved.

When the polycrystalline silicon film was polished for 60 seconds using the CMP slurry composition for polishing polycrystalline silicon of Example 2, a value of the maximum peak-to-valley (Rpv) surface roughness is 2.07 nm and a value of the arithmetic average roughness Ra is 0.2 nm. It may be confirmed that the value of the maximum peak-to-valley (Rpv) surface roughness and the value of the arithmetic average roughness Ra were noticeably reduced.

Figure 2:
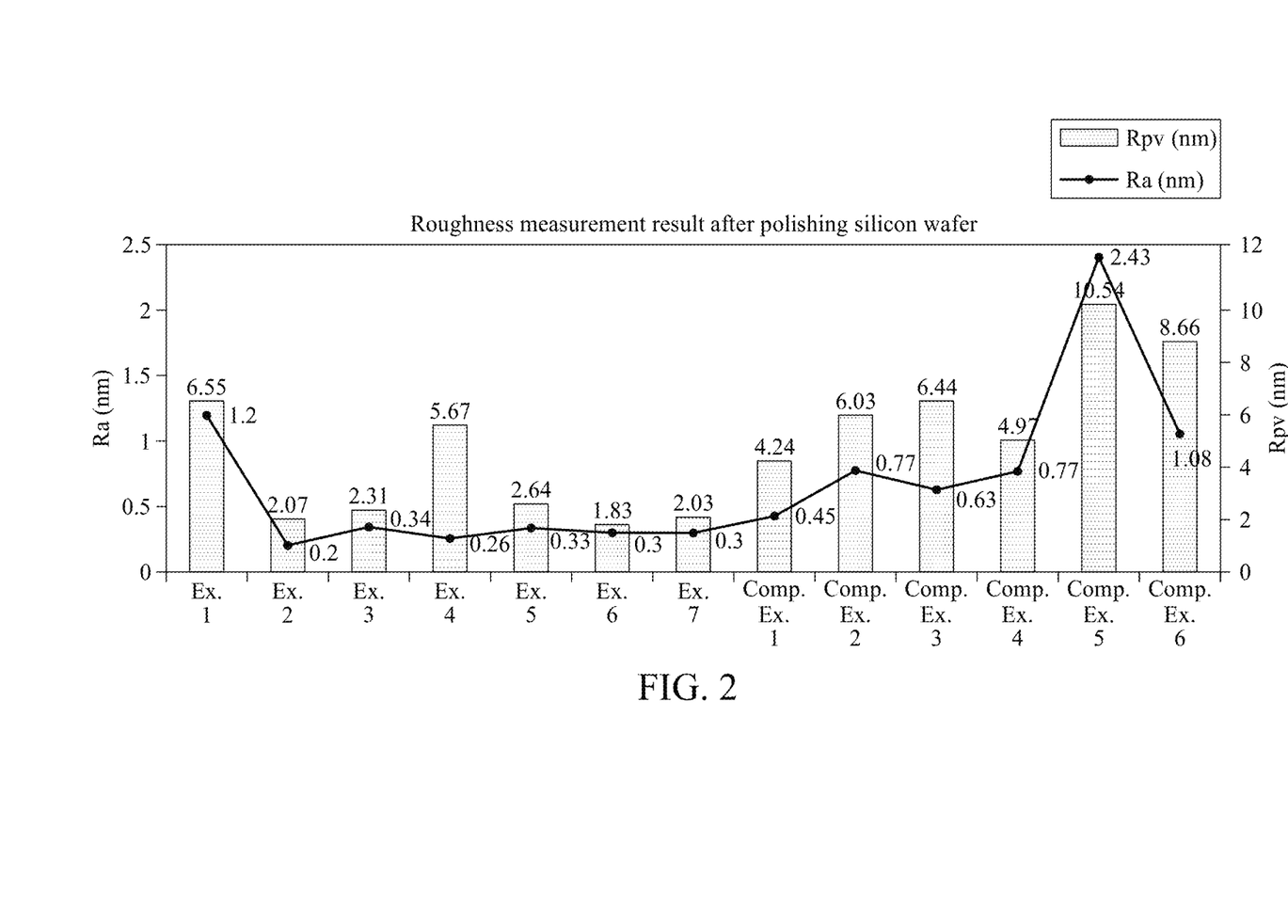
FIG. 2 is a graph showing surface roughness measured after a polycrystalline silicon wafer is polished using CMP slurry compositions for polishing polycrystalline silicon according to Examples 1 to 7 and Comparative Examples 1 to 6 of the present disclosure.

FIG. 2 is a graph showing surface roughness measured after a polycrystalline silicon wafer is polished using the CMP slurry compositions for polishing polycrystalline silicon according to Examples 1 to 7 and Comparative Examples 1 to 6 of the present disclosure. Referring to FIG. 2, it may be found that values of the maximum peak-to-valley (Rpv) surface roughness and values of the arithmetic average roughness Ra are significantly low in Examples 1 to 7 in which hydroxyethyl cellulose (HEC) was added, compared to Comparative Examples 1 to 6 in which hydroxyethyl cellulose (HEC) was not added as a surface roughness modifier.

Specifically, referring to Table 1 and FIG. 2, when a polycrystalline silicon film is polished using the CMP slurry composition for polishing polycrystalline silicon of Example 1, a value of the maximum peak-to-valley (Rpv) surface roughness is 6.55 nm and a value of the arithmetic average roughness Ra is 1.2 nm. Although Comparative Example 5 has the same polishing conditions as Example 1, a surface roughness modifier was not added in Comparative Example 5. The value of maximum peak-to-valley (Rpv) surface roughness and the value of arithmetic average roughness Ra of Example 1 are higher than those of the other examples, because the polishing time is less than the other examples. Accordingly, it may be confirmed that the value of maximum peak-to-valley (Rpv) surface roughness and the value of arithmetic average roughness Ra of Example 1 are noticeably reduced in comparison to Comparative Example 5.

It may be confirmed that a value of maximum peak-to-valley (Rpv) surface roughness and a value of arithmetic average roughness Ra of Example 4 are noticeably reduced in comparison to Comparative Example 6, because a surface roughness modifier was not added in Comparative Example 6, although Comparative Example 6 has the same polishing conditions as Comparative Example 4.

While this disclosure includes specific example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example embodiment are to be considered as being applicable to similar features or aspects in other example embodiments. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is not limited by the detailed description, but further supported by the claims and their equivalents, and all variations within the scope of the claims and their equivalents are to be construed as being included in the disclosure.

The invention claimed is:

1. A chemical mechanical polishing (CMP) slurry composition for polishing polycrystalline silicon, the CMP slurry composition comprising:
    abrasive particles;
    surface roughness modifier;
    a polishing regulator including an organic acid; and
    a pH regulator,
    wherein the abrasive particles comprise a silica in a colloidal phase,
    wherein the surface roughness modifier comprises a water-soluble polymer,
    wherein the water-soluble polymer comprises at least one selected from a group consisting of hydroxyethyl cellulose (HEC), hydroxymethyl cellulose (HMC), hydroxypropyl cellulose (HPC), methyl hydroxyethyl cellulose (MHEC), chitosan, gelatin, xanthan gum, collagen, carrageenan, flurane, pectin, chondroitin sulfate, alginic acid, dextran, beta-glucan, and hyaluronic acid;
    wherein the water-soluble polymer has a weight-average molecular weight of 1,000 or more but less than 100,000; and
    wherein the surface roughness modifier is present in an amount of 0.0005 wt % to 0.5 wt % in the CMP slurry composition.

2. The CMP slurry composition of claim 1, wherein the abrasive particles are prepared using a liquid-phase synthesis method and are dispersed so that surfaces of the abrasive particles have negative charges.

3. The CMP slurry composition of claim 1, wherein the abrasive particles have a size of 10 nanometers (nm) to 200 nm.

4. The CMP slurry composition of claim 1, wherein the abrasive particles are present in an amount of 0.1% by weight (wt %) to 10 wt % in the CMP slurry composition.

5. The CMP slurry composition of claim 1, wherein the organic acid comprises at least one selected from a group consisting of succinic acid, malic acid, malonic acid, adipic acid, tartaric acid, glutaric acid, glycollic acid, aspartic acid, itaconic acid, tricarballylic acid, pimelic acid, suberic acid, sebacic acid, stearic acid, pyruvic acid, acetoacetic acid, glyoxylic acid, azelaic acid, fumaric acid, glutaconic acid, traumatic acid, muconic acid, aconitic acid, carballylic acid, tribasic acid, mellitic acid, isocitric acid, citric acid, lactic acid, gluconic acid, maleic acid, ascorbic acid, iminoacetic acid, oxalic acid, pyrogallic acid, formic acid, acetic acid, propionic acid, butyric acid, valeric acid, hexanoic acid, heptanoic acid, caprylic acid, nonanoic acid, decanoic acid, undecylenic acid, lauric acid, tridecylic acid, myristic acid, pentadecanoic acid, and palmitic acid.

6. The CMP slurry composition of claim 1, wherein the polishing regulator is present in an amount of 0.01 wt % to 1 wt % in the CMP slurry composition.

7. The CMP slurry composition of claim 1, wherein the pH regulator comprises at least one selected from a group consisting of triethanolamine, trimethanolamine, monoethanolamine, diethanolamine, dimethylbenzylamine, ethoxybenzylamine, 2-amino-2-methyl-1-propanol, 2-amino-2-ethyl-1,3-propanediol, tris(hydroxymethyl)aminomethane, 2-amino-1-butanol, 2-amino-2-methyl-1,3-propanediol, dimethylamino methylpropanol, diethylaminoethanol, monoisopropanolamine, aminoethylethanolamine, 3-amino-1-propanol, 2-amino-1-propanol, 1-amino-2-propanol, 1-amino-pentanol, 2-(2-aminoethylamino) ethanol, 2-dimethylamino-2-methyl-1-propanol, and N,N-diethylethanolamine.

8. The CMP slurry composition of claim 1, wherein the pH regulator is present in an amount of 0.01 wt % to 1 wt % in the CMP slurry composition.

9. The CMP slurry composition of claim 1, wherein pH of the CMP slurry composition for polishing polycrystalline silicon is in a range of 3 to 7.

10. The CMP slurry composition of claim 1, wherein after the polycrystalline silicon is polished using the CMP slurry composition, the polished polycrystalline silicon has a maximum peak-to-valley (Rpv) surface roughness of 4 nm or less and an arithmetic average roughness Ra of 0.4 nm or less.

11. The CMP slurry composition of claim 1, wherein the slurry composition for polishing polycrystalline silicon is used to remove a hillock on a polycrystalline silicon film.

12. A polishing method comprising polishing a semiconductor wafer comprising a polycrystalline silicon film using the CMP slurry composition of claim 1.

* * * * *